United States Patent
Lee et al.

(10) Patent No.: US 8,808,837 B2
(45) Date of Patent: Aug. 19, 2014

(54) FLEXIBLE FILM AND DISPLAY DEVICE COMPRISING THE SAME

(75) Inventors: Sang Gon Lee, Cheongju-si (KR); Dae Sung Kim, Seoul (KR); Woo Hyuck Chang, Seoul (KR)

(73) Assignee: LG Electronics Inc., Seoul (KR)

( * ) Notice: Subject to any disclaimer, the term of this patent is extended or adjusted under 35 U.S.C. 154(b) by 292 days.

(21) Appl. No.: 12/125,156

(22) Filed: May 22, 2008

(65) Prior Publication Data

US 2009/0162607 A1 Jun. 25, 2009

(30) Foreign Application Priority Data

Dec. 21, 2007 (KR) .................. 10-2007-0135502

(51) Int. Cl.
*B32B 3/10* (2006.01)

(52) U.S. Cl.
USPC ........... 428/137; 257/774; 257/775; 257/776; 257/777; 257/758; 428/1.4; 349/147; 349/150; 174/254; 174/255; 174/258

(58) Field of Classification Search
USPC ......... 257/668, 750, 758, 756, 773, 737, 174, 257/175, 176, 177; 156/645; 428/137, 1.4; 361/750; 174/254, 255, 258; 349/147, 349/150
See application file for complete search history.

(56) References Cited

U.S. PATENT DOCUMENTS

| | | | |
|---|---|---|---|
| 3,668,003 A | 6/1972 | Furness | |
| 3,753,816 A | 8/1973 | Feldstein et al. | |
| 4,610,756 A * | 9/1986 | Strobel | 216/18 |
| 5,042,919 A | 8/1991 | Yabu et al. | |
| 5,603,158 A | 2/1997 | Murata et al. | |
| 5,729,051 A | 3/1998 | Nakamura | |
| 5,975,178 A | 11/1999 | Otsuka et al. | |
| 6,342,932 B1 | 1/2002 | Terao et al. | |
| 6,426,548 B1 | 7/2002 | Mita et al. | |
| 6,433,414 B2 | 8/2002 | Saito | |
| 6,448,634 B1 * | 9/2002 | Hashimoto | 257/668 |
| 6,703,702 B2 | 3/2004 | Inoue et al. | |
| 7,095,476 B2 | 8/2006 | Lo et al. | |
| 7,492,433 B2 | 2/2009 | Imajo et al. | |
| 7,593,085 B2 | 9/2009 | Watanabe et al. | |
| 2001/0009299 A1 | 7/2001 | Saito | |
| 2001/0022568 A1 | 9/2001 | Kang | |
| 2003/0024666 A1 | 2/2003 | Suzuki et al. | |
| 2003/0098513 A1 | 5/2003 | Huang | |
| 2003/0227592 A1 | 12/2003 | Izumi et al. | |
| 2004/0139600 A1 * | 7/2004 | Huang et al. | 29/831 |

(Continued)

FOREIGN PATENT DOCUMENTS

| CN | 1254105 A | 5/2000 |
|---|---|---|
| CN | 1314671 A | 9/2001 |

(Continued)

*Primary Examiner* — Gwendolyn Blackwell
*Assistant Examiner* — Ruiyun Zhang
(74) *Attorney, Agent, or Firm* — Birch, Stewart, Kolasch & Birch, LLP

(57) ABSTRACT

A flexible film is provided. The flexible film includes a dielectric film, a metal layer disposed on the dielectric film, and at least one hole formed through the dielectric film and the metal layer. Therefore, it is possible to facilitate the alignment of circuit patterns on a flexible film with an electrode of a panel of a display device or a circuit of a driving unit of a display device.

9 Claims, 9 Drawing Sheets

(56) References Cited

U.S. PATENT DOCUMENTS

| | | |
|---|---|---|
| 2004/0140551 A1 | 7/2004 | Usui et al. |
| 2004/0231878 A1 | 11/2004 | Higashida et al. |
| 2004/0245628 A1* | 12/2004 | Chung ............ 257/734 |
| 2005/0019598 A1 | 1/2005 | Katsuki et al. |
| 2005/0067739 A1 | 3/2005 | Onodera et al. |
| 2005/0096429 A1 | 5/2005 | Lee et al. |
| 2005/0140876 A1 | 6/2005 | Kubo |
| 2005/0168304 A1 | 8/2005 | Yamaguchi et al. |
| 2005/0183884 A1 | 8/2005 | Su |
| 2005/0260391 A1 | 11/2005 | Nakamura et al. |
| 2006/0042750 A1 | 3/2006 | Usuki et al. |
| 2006/0055023 A1 | 3/2006 | Ho et al. |
| 2006/0060949 A1 | 3/2006 | Naitoh |
| 2006/0060961 A1 | 3/2006 | Lin et al. |
| 2006/0079029 A1 | 4/2006 | Nakamura |
| 2006/0115670 A1 | 6/2006 | Tanaka et al. |
| 2006/0158120 A1* | 7/2006 | Kim et al. ............ 313/634 |
| 2006/0163718 A1 | 7/2006 | Kurihara |
| 2006/0286832 A1 | 12/2006 | Van Schuylenbergh et al. |
| 2007/0013856 A1 | 1/2007 | Watanabe et al. |
| 2007/0023877 A1 | 2/2007 | Yamazaki |
| 2007/0070609 A1 | 3/2007 | Lim et al. |
| 2007/0101571 A1 | 5/2007 | Kataoka et al. |
| 2007/0153427 A1 | 7/2007 | Izumi et al. |
| 2007/0182440 A1 | 8/2007 | Cha |
| 2007/0224412 A1 | 9/2007 | Hara et al. |
| 2008/0055291 A1 | 6/2008 | Hwang et al. |
| 2008/0251940 A1 | 10/2008 | Lee et al. |
| 2008/0284014 A1 | 11/2008 | Lee et al. |
| 2009/0228131 A1 | 9/2009 | Wolk et al. |
| 2009/0273740 A1 | 11/2009 | Yoshizawa |
| 2009/0311519 A1 | 12/2009 | Nagata et al. |

FOREIGN PATENT DOCUMENTS

| | | | |
|---|---|---|---|
| CN | 1551712 A | | 12/2004 |
| CN | 1584679 A | | 2/2005 |
| CN | 1720136 A | | 1/2006 |
| CN | 1891018 A | | 1/2007 |
| CN | 101050846 A | | 10/2007 |
| DE | 202005010364 U1 | | 9/2005 |
| EP | 0284939 A2 | | 10/1988 |
| EP | 0 493 870 A2 | | 7/1992 |
| EP | 0773710 A1 | | 5/1997 |
| EP | 1 008 896 A1 | | 6/2000 |
| EP | 1529812 A1 | | 5/2005 |
| EP | 1 599 078 A1 | | 11/2005 |
| EP | 1617655 A1 | | 1/2006 |
| JP | 52-138660 | | 11/1977 |
| JP | 63-305587 A | | 12/1988 |
| JP | 5-136547 A | | 6/1993 |
| JP | 11-118866 A | | 4/1994 |
| JP | 6-342969 A | | 12/1994 |
| JP | 7-191339 A | | 7/1995 |
| JP | 7-292103 A | | 11/1995 |
| JP | 8-78599 A | | 3/1996 |
| JP | 9-123343 A | | 5/1997 |
| JP | 9-193292 A | | 7/1997 |
| JP | 11-16954 A | | 1/1999 |
| JP | 2001-34190 A | | 2/2001 |
| JP | 2001-264794 A | | 9/2001 |
| JP | 2001-267376 A | | 9/2001 |
| JP | 2002-290028 A | | 10/2002 |
| JP | 2003-45917 A | | 2/2003 |
| JP | 2003-321656 A | | 11/2003 |
| JP | 2005-64265 A | | 3/2005 |
| JP | 2005-142572 A | | 6/2005 |
| JP | 2005-199481 A | | 7/2005 |
| JP | 2005-286275 A | | 10/2005 |
| JP | 2005-333028 A | | 12/2005 |
| JP | 2006-104504 A | | 4/2006 |
| JP | 2006-108270 A | | 4/2006 |
| JP | 2007-129208 A | | 5/2007 |
| JP | 2007-136677 A | | 6/2007 |
| JP | 2007-186586 A | | 7/2007 |
| JP | 2007-201442 A2 | | 8/2007 |
| JP | 2007-216688 A | | 8/2007 |
| JP | 2007-223312 A | | 9/2007 |
| KR | 10-2003-0074429 A | | 9/2003 |
| KR | 10-2007-0088611 A | | 8/2007 |
| TW | 370695 | | 9/1999 |
| TW | 450982 | | 8/2001 |
| TW | 486922 | | 5/2002 |
| TW | 200505300 | | 2/2005 |
| TW | 200625346 | | 7/2006 |
| TW | 200712635 | | 4/2007 |
| TW | 200746933 | | 12/2007 |
| WO | WO 2007/020697 A | | 2/2007 |
| WO | WO-2007/102691 A1 | | 9/2007 |
| WO | WO 2007/132529 A1 | | 11/2007 |
| WO | 2007/139479 A1 | | 12/2007 |

* cited by examiner

FLEXIBLE FILM AND DISPLAY DEVICE COMPRISING THE SAME

This application claims priority from Korean Patent Application No. 10-2007-0135502 filed on Dec. 21, 2007 in the Korean Intellectual Property Office, the disclosure of which is incorporated herein by reference in its entirety.

BACKGROUND OF THE INVENTION

1. Field of the Invention

The present invention relates to a flexible film, and more particularly, to a flexible film which includes a dielectric film and a metal layer, has at least one hole formed through the dielectric film and the metal layer and can thus facilitate the alignment of circuit patterns with an electrode of a panel of a display device or a circuit of a driving unit of the display device during the manufacture of the display device.

2. Description of the Related Art

With recent improvements in flat panel display technology, various types of flat panel display devices such as a liquid crystal display (LCD), a plasma display panel (PDP), and an organic light-emitting diode (OLED) have been developed. Flat panel display devices include a driving unit and a panel and display images by transmitting image signals from the driving unit to a plurality of electrodes included in the panel.

Printed circuit boards (PCBs) may be used as the driving units of flat panel display devices. That is, PCBs may apply image signals to a plurality of electrodes included in a panel and thus enable the panel to display images.

SUMMARY OF THE INVENTION

The present invention provides a flexible film which has at least one hole and can thus contribute to the reduction of the size of glass substrates and facilitate the alignment of circuit patterns with an electrode of a panel of a display device or a circuit of a driving unit of a display device.

According to an aspect of the present invention, there is provided a flexible film including a dielectric film; a metal layer disposed on the dielectric film; and at least one hole formed through the dielectric film and the metal layer.

According to another aspect of the present invention, there is provided a flexible film including a dielectric film; a metal layer disposed on the dielectric film; an integrated circuit (IC) chip disposed on the metal layer; and at least one hole formed through the dielectric film and the metal layer.

According to another aspect of the present invention, there is provided a display device including a panel; a driving unit; and a flexible film disposed between the panel and the driving unit, wherein the flexible film comprises a dielectric film, a metal layer disposed on the dielectric film comprising circuit patterns and at least one hole formed through the dielectric film and the metal layer. The ratio of the thickness of the metal layer to the thickness of the dielectric film may be about 1:1.5 to 1:10.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

The present invention will hereinafter be described in detail with reference to the accompanying drawings in which exemplary embodiments of the invention are shown.

Figure 1A:
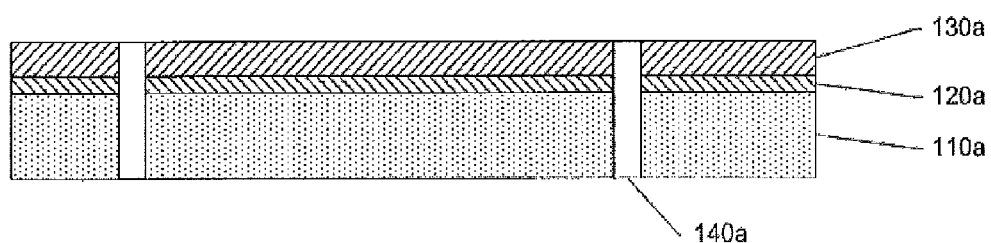
FIGS. 1A through 1F illustrate cross-sectional views of flexible films according to embodiments of the present invention.
Figure 1B:
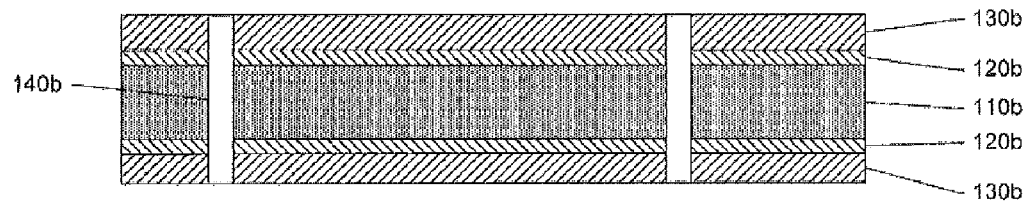

FIGS. 1A through 1F illustrate cross-sectional views of flexible films according to embodiments of the present invention. More specifically, FIG. 1A illustrates a cross-sectional view of a flexible film 100a, which is one-sided and has a double metal layer structure, and FIG. 1B illustrates a cross-sectional view of a flexible film 100b, which is double-sided and has a double metal layer structure. Referring to FIG. 1A, the flexible film 100a includes a dielectric film 110a, a first metal layer 120a, which is disposed on the dielectric film 110a, and a second metal layer 130a, which is disposed on the first metal layer 120a. Referring to FIG. 1B, the flexible film 100b includes a dielectric film 110b, two first metal layers 120b, which are disposed on the top surface and the bottom surface, respectively, of the dielectric film 110b, and two second metal layers 130b, which are disposed on the respective first metal layers 120b.

The dielectric film 110a, which is a base film of the flexible film 100a, and the dielectric film 110b, which is base film of the flexible film 100b, may be formed of a dielectric polymer material. For example, the dielectric film 110a or 110b may include at least one of polyimide, a liquid crystal polymer and polyester. The thermal expansion coefficient, absorbency, tensile strength and thermal shrinkage of the dielectric film 110a or the dielectric film 110b may considerably affect the properties of the flexible film 100a or 100b. Therefore, the dielectric film 110a or 110b may be formed of polyimide, which has excellent thermal expansion coefficient, absorbency, tensile strength and thermal shrinkage properties. Alternatively, the dielectric film 110a or 110b may be formed of a liquid crystal polymer, which has excellent thermal expansion coefficient and absorbency properties.

The first metal layer 120a, which is a seed layer of the flexible film 110a, and the first metal layers 120b, which are seed layers of the flexible film 110b, may be formed of at least one of nickel, chromium, gold and copper by using an electroless plating method. The first metal layer 120a or the first metal layers 120b may be formed using an electroless plating method. For example, the first metal layer 120a or the first metal layers 120b may be formed of copper by using an electroless plating method. More specifically, the dielectric film 110a or the dielectric film 110b may be immersed in an electroless plating solution containing copper ions, and then copper may be extracted from the electroless plating solution by using a reducing agent, thereby forming the first metal layer 120a or the first metal layers 120b. The first metal layer 120a or the first metal layers 120b may be formed of copper to a thickness of 9 μm.

The second metal layer 130a or the second metal layers 130b may be formed using an electroplating method. The second metal layer 130a or the second metal layers 130b may be formed of gold or copper. Particularly, the second metal layer 130a or the second metal layers 130b may be formed of copper in order to reduce the manufacturing cost of the flexible films 100a and 100b.

Table 1 below shows the relationship between the ratio of the thickness of a metal layer to the thickness of a dielectric layer and the properties of a flexible film when the dielectric layer has a thickness of 38 μm.

TABLE 1

| Thickness of Metal Layer:Thickness of Dielectric Film | Flexibility | Peel Strength |
|---|---|---|
| 1:1.4 | X | ◎ |
| 1:1.5 | O | O |
| 1:2 | O | O |
| 1:4 | O | O |
| 1:6 | O | O |
| 1:8 | O | O |
| 1:10 | O | O |
| 1:11 | O | X |
| 1:12 | ◎ | X |
| 1:13 | ◎ | X |

Referring to Table 1, electroless plating or electroplating may be performed so that the ratio of the sum of the thicknesses of the first metal layer 120a and the second metal layer 130a to the thickness of the dielectric film 110a can be within the range of 1:1.5 to 1:10. If the sum of the thicknesses of the first metal layer 120a and the second metal layer 130a is less than one tenth of the thickness of the dielectric film 110a, the peel strength of the first metal layer 120a and the second metal layer 130a may decrease, and thus, the first metal layer 120a and the second metal layer 130a may be easily detached from the dielectric film 110a or the stability of the dimension of circuit patterns on the first metal layer 120a and the second metal layer 130a may deteriorate.

On the other hand, if the sum of the thicknesses of the first metal layer 120a and the second metal layer 130a is greater than two thirds of the thickness of the dielectric film 110a, the flexibility of the flexible film 110a may deteriorate, or the time taken to perform plating may increase, thereby increasing the likelihood of the first and second metal layers 120a and 130a being damaged by a plating solution.

This applies not only to double-sided flexible films but also to single metal layer and triple metal layer flexible films.

When the second metal layer 130a or the second metal layers 130b are formed using an electroplating method, the efficiency of electroplating may decrease due to the resistance of the first metal layer 120a or the first metal layers 120b. In order to address this, the first metal layer 120a or the first metal layers 120b may be formed of a metal having low resistance. For example, the first metal layer 120a or the first metal layers 120b may be formed of copper, which has low resistance, thereby increasing the efficiency of electroplating for forming the second metal layer 130a or the second metal layers 130b. The thickness of the first metal layer 120a or the first metal layers 120b may be determined in consideration of resistance.

Circuit patterns may be formed by etching the first metal layer 120a and 120b and the second metal layer 130a and 130b. The circuit patterns may have a pitch of several tens of micrometers. The circuit patterns may be connected to an electrode of a panel of a display device or a circuit of a driving unit of a display device and may transmit image signals provided by the driving unit to the panel. If the flexible film 100a or 100b is used in a tape carrier package (TCP) or a chip-on-film (COF), the circuit patterns of the flexible film 100a or 100b may include inner leads connected to an integrated circuit (IC) in the TCP or the COF and outer leads connected to a circuit of a driving unit or to an electrode of a panel.

Referring to FIGS. 1A and 1B, the flexible film 100a or 100b may include at least one or more holes 140a or 140b. The holes 140a or 140b may be formed through etching and may be spaced apart from circuit patterns of the flexible film 100a or 100b. The holes 140a or 140b facilitate the alignment of the circuit patterns of the flexible film 100a or 100b with a circuit of a driving unit or an electrode of a panel. The holes 140a or 140b may be used for testing the reliability of the flexible film 100a or 100b.

In order to protect the circuit patterns of the flexible film 100a or 100b, an adhesive layer and a protective film may be attached onto the flexible film 100a or 100b. The protective film may include a dielectric material that can protect the circuit patterns of the flexible film 100a or 100b. For example, the protective film may include polyethylene terephthalate (PET).

The adhesive layer, which is used to attach the protective film onto the flexible film 100a or 100b, may include epoxy. The adhesive layer may be formed to a thickness of 2-10 μm. If the adhesive layer has a thickness of less than 2 μm, the protective film may easily be detached from the flexible film 100a or 100b during the transportation or the storage of the flexible film 100a or 100b. If the adhesive layer has a thickness of more than 10 μm, the manufacturing cost of the flexible film 100a or 100b and the time taken to manufacture the flexible film 100a or 100b may increase, and it may be very difficult to remove the protective film.

Figure 1C:
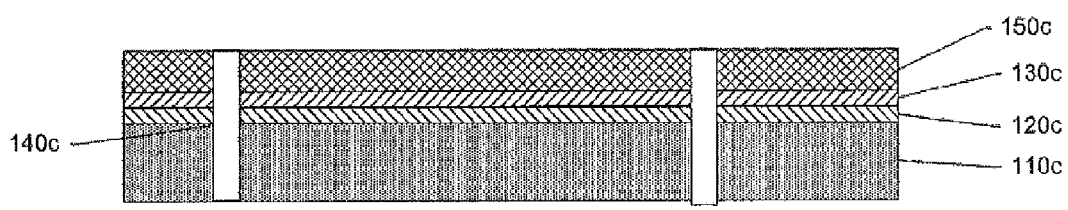
Figure 1D:
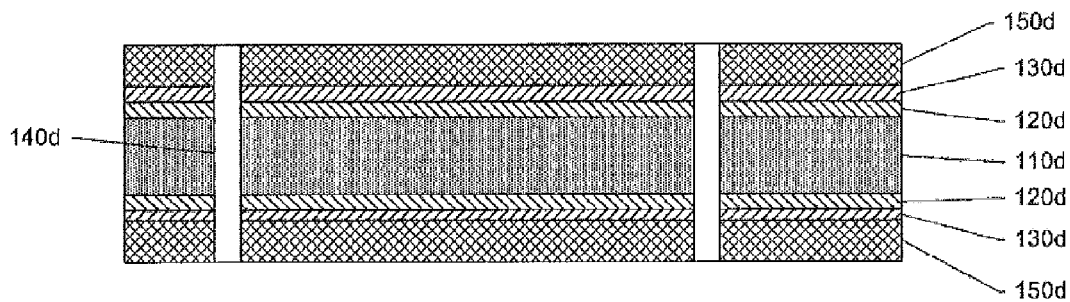

FIGS. 1C and 1D illustrate cross-sectional views of flexible films 100c and 100d, respectively. Referring to FIG. 1C, the flexible film 100c has a triple metal layer structure and is single-sided. Referring to FIG. 1D, the flexible film 100d also has a triple metal layer structure and is double-sided.

The flexible film 100c includes a dielectric film 110c, a first metal layer 120c which is disposed on the dielectric film 100c, a second metal layer 130c which is disposed on the first metal layer 130c, and a third metal layer 150c which is disposed on the second metal layer 130c. The flexible film 100d includes a dielectric film 110d, two first metal layers 120d which are disposed on the top surface and the bottom surfaces, respectively, of the dielectric film 110d, two second metal layers 130d which are disposed on the respective first metal layers 120d, and two third metal layers 150d which are disposed on the respective second metal layers 130d. The first metal layer 120c, the first metal layers 120d, the second metal layer 130c, and the second metal layers 130d may be formed through sputtering, and the third metal layer 150c and the third metal layers 150d may be formed through electroplating.

More specifically, the first metal layer 120c or the first metal layers 120d may be formed through sputtering. The first metal layer 120c or the first metal layers 120d may be formed of an alloy of nickel and chromium, and particularly, an alloy of 93% nickel and 7% chromium or an alloy of 97% nickel and 3% chromium. The first metal layer 120c and the first metal layers 120d may be formed to a thickness of about 30 nm.

If the first metal layer 120c or the first metal layers 120d are formed of an alloy of nickel and chromium, the efficiency of electroplating for forming the third metal layer 150c or the third metal layers 150d may decrease due to a high resistance of the alloy of nickel and chromium. Therefore, the second metal layer 130c or the second metal layers 130d may be formed of a metal having low resistance, thereby increasing the efficiency of electroplating for forming the third metal layer 150c or the third metal layers 150d.

If the first metal layer 120c or the first metal layers 120d are formed of an alloy of nickel and chromium, the second metal layer 130c or the second metal layers 130d may be formed of a highly-conductive metal on the first metal layer 120c or the first metal layers 120d by using sputtering in order to reduce the resistance of the first metal layer 120c or the first metal layers 120d. The second metal layer 130c or the second metal layers 130d may be formed of copper. The sum of the thicknesses of the first metal layer 120c and the second metal layer 130c or the sum of the thicknesses of the first metal layers 120d and the second metal layers 130d may be about 30 nm.

The third metal layer 150c or the third metal layers 150d may include a highly-conductive metal such as gold or copper. The third metal layer 150c or the third metal layers 150d may be formed through electroplating. Once the third metal layer 150c or the third metal layers 150d are formed, circuit patterns are formed on the metal layer and one or more holes 140c or 140d are formed through the flexible film 100c or 100d. The holes 140a or 140b facilitate the alignment of the circuit patterns of the flexible film 100c or 100d with a circuit of a driving unit or an electrode of a panel. In addition, the holes 140a or 140b may increase the efficiency of testing the flexible film 100c or 100d.

Figure 1E:
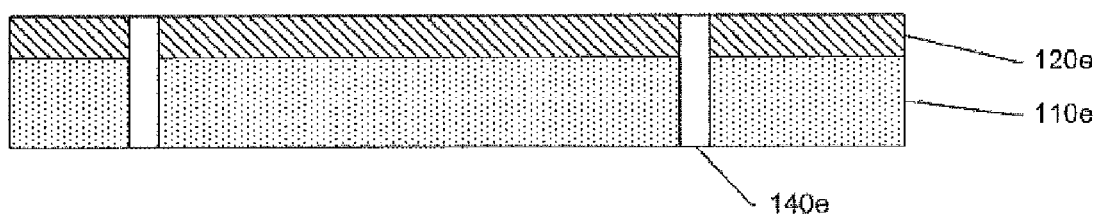
Figure 1F:
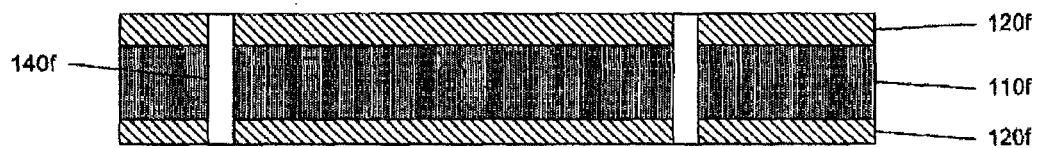

FIGS. 1E and 1F illustrate cross-sectional views of a flexible film 100e and a flexible film 100f, respectively. Referring to FIG. 1E, the flexible film 100e has a single metal layer structure and is single-sided. Referring to FIG. 1F, the flexible film 100f also has a single metal layer structure and is double-sided.

The flexible film 100e includes a dielectric film 110e and a metal layer 120e which is disposed on the dielectric film 110e. The flexible film 110f includes a dielectric film 110f and two metal layers 120f which are disposed on the top surface and the bottom surface, respectively of the dielectric film 110f. The metal layer 120e and the metal layers 120f may be formed through casting or laminating. In order to effectively transmit electric signals, the metal layer 120e or the metal layers 120f may be formed of a highly-conductive metal such as copper.

The metal layer 120e and the metal layers 120f may be formed through laminating. More specifically, an adhesive may be applied onto the dielectric film 110e or 110f and the dielectric film 110e or 110f may be baked in an oven so that the adhesive can be fixed onto the dielectric film 110e or 110f. Thereafter, the metal layer 120e or the metal layers 120f may be laid over the dielectric film 110e or 110f, and press processing may be performed on the metal layer 120e or the metal layers 120f, thereby forming the flexible film 100e or 100f.

Alternatively, the metal layer 120e and the metal layers 120f may be formed through casting. More specifically, a liquid-phase precursor of the dielectric film 110e or 110f may be applied, and may then be dried and hardened in an oven at high temperature, thereby forming the flexible film 100c or 100f.

Once the metal layer 120e and the metal layers 120f are formed either through casting or through laminating, circuit patterns are formed on the metal layer 120e and the metal layers 120f, and one or more holes 140e or 140f are formed through the flexible film 100e or 100f. The holes 140a or 140b facilitate the alignment of the circuit patterns on the metal layer 120e and the metal layers 120f with a circuit of a driving unit or an electrode of a panel. In addition, the holes 140a or 140b may increase the efficiency of testing flexible film 100c or 100d.

Figure 2A:
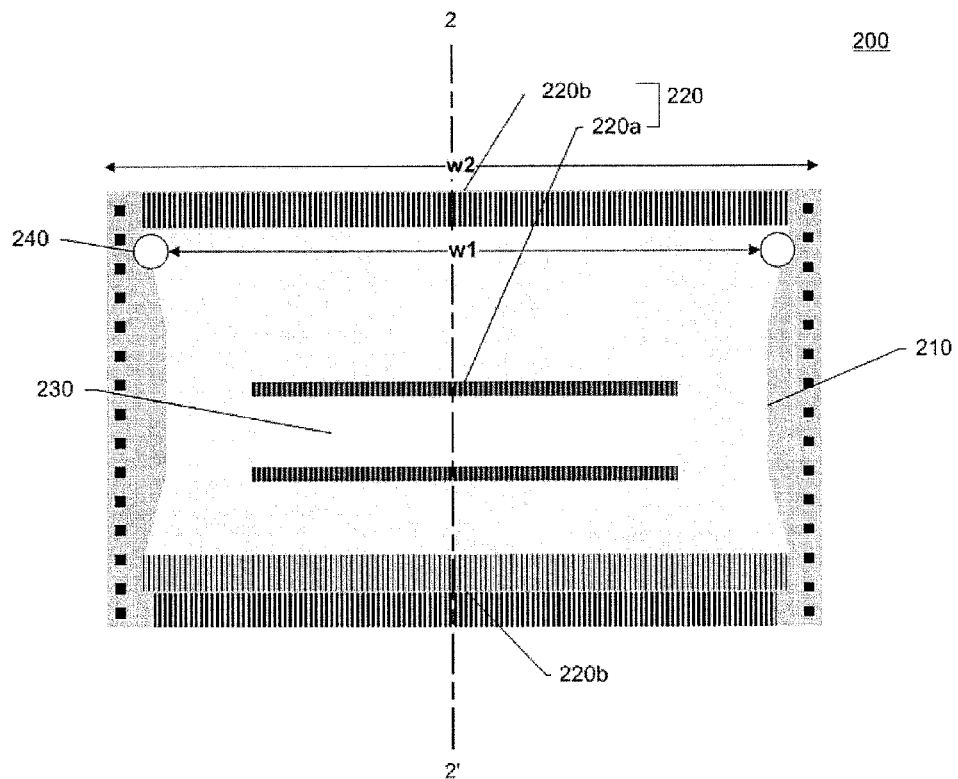
FIGS. 2A and 2B illustrate diagrams of a tape carrier package (TCP) comprising a flexible film according to an embodiment of the present invention.
Figure 2B:
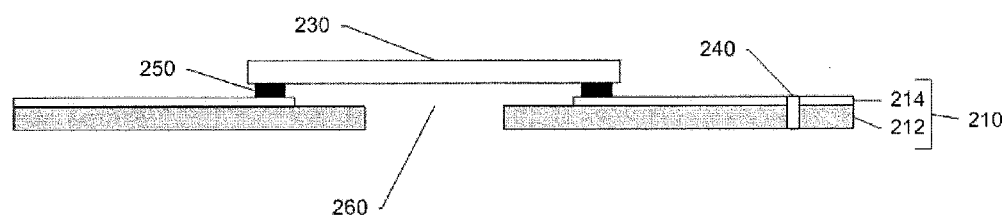

FIGS. 2A and 2B illustrate a plan view and a cross-sectional view, respectively, of a TCP 200 including a flexible film 210 according to an embodiment of the present invention. Referring to FIG. 2A, the TCP 200 includes the flexible film 210, circuit patterns 220, which are formed on the flexible film 210, an IC 230, which is connected to the circuit patterns 220, and one or more holes 240.

FIG. 2B illustrates a cross-sectional view taken along line 2-2' of FIG. 2A. Referring to FIG. 2B, the flexible film 210 may include a dielectric film 212 and a metal layer 214, which is formed on the dielectric film 212. The dielectric film 212 may include a polymer material such as a liquid crystal polymer, polyimide or polyester. The metal layer 214 may have a single-, double-, or triple-layer structure.

If the metal layer 214 has a single-layer structure, the metal layer 214 may be formed of a conductive metal such as nickel, chromium, gold or copper by using casting or laminating. If the metal layer 214 has a double-layer structure, the metal layer 214 may include a first metal layer, which is formed on the dielectric film 212, and a second metal layer, which is formed on the first metal layer.

The first metal layer may include nickel, chromium, gold or copper and may be formed through sputtering or electroless plating. More specifically, the first metal layer may be formed of an alloy of nickel and chromium through sputtering. Alternatively, the first metal layer may be formed of copper through electroless plating. The second metal layer may be formed through electroplating, which involves applying a current to a plating solution containing metal ions.

If the metal layer 214 has a triple-layer structure, the metal layer 214 may also include a copper layer, which is formed on the first metal layer through sputtering. When the first metal layer is formed of an alloy of nickel and chromium, the efficiency of electroplating for forming the second metal layer may deteriorate due to an alloy of nickel and chromium having high resistance. In order to address this, the copper layer may be additionally formed on the first metal layer through sputtering, thereby reducing the resistance of the first metal layer. In this manner, it is possible to obtain a metal layer 214 having a triple-layer structure and to improve the efficiency of electroplating.

The circuit patterns 220 may be formed by etching the metal layer 214 of the flexible film 210. The circuit patterns 220 include inner leads 220a, which are connected to the IC 230, and outer leads 220b, which are connected to a circuit of a driving unit of a display device or an electrode of a panel of a display device. The pitch of the circuit patterns 220 may vary according to the resolution of a display device comprising the TCP 200. For example, the inner leads 220a may have a pitch of about 40 µm, and the outer leads 220b may have a pitch of 60 µm.

Referring to FIG. 2A, the flexible film 210 includes one or more holes 240. The holes 240 may be formed on the circuit patterns 220 or may be spaced apart from the circuit patterns 220. The holes 240 may be used for aligning the TCP 200 with a circuit of a driving unit of a display device or an electrode of a panel of a display device. More specifically, the TCP 200 may be aligned with a driving unit of a display device or a panel of a display device by connecting alignment portions of a circuit of the driving unit or alignment portions of an electrode of the panel to the holes 240.

The holes 240 may be used for testing the reliability of the TCP 200. More specifically, the holes 240 may be used for inspecting the pitch of the circuit patterns 220 of the flexible film 210 and for testing the coupling between the IC 230 and the circuit patterns 220. For example, the TCP 200 may be fixed to a testing device through the holes 240, and various tests (such as those for the reliability of the circuit patterns 220 and the IC 230) may be performed on the TCP 200.

TABLE 2

| w1/w2 × 100 (%) | Quality of Circuit Patterns | Quality of TCP |
| --- | --- | --- |
| 30 | Bad | Good |
| 40 | Bad | Good |
| 50 | Good | Good |
| 60 | Good | Good |
| 70 | Good | Good |
| 80 | Good | Good |
| 90 | Good | Bad |

Referring to Table 2, when the flexible film 210 includes two holes 240, as illustrated in FIG. 2A, a distance w1 between the first hole and the second hole 240 may be 50-80% of a width w2 of the dielectric film. If the distance w1 is less than 50% of the width w2, the circuit patterns 220 may become defective. On the other hand, if the distance w1 is greater than 80% of the width w2, the holes 240 and the TCP 200 may not be able to be properly manufactured because the holes 240 are too close to either side of the TCP 200.

FIG. 2B illustrates a cross-sectional view taken along line 2-2' of FIG. 2A. Referring to FIG. 2B, the TCP 200 includes the flexible film 210, the IC 230, a hole 240, which is formed through the flexible film 210, gold bumps 250, which connect the IC 230 to the inner leads 220a, and a device hole 260, which is formed in an area in which the IC 230 is disposed.

The flexible film 210 includes the dielectric film 212 and the metal layer 214, which is formed on the dielectric film 212. The dielectric film 212 is a base film of the flexible film 210 and may be formed of a dielectric material such as polyimide, polyester, or a liquid crystal polymer. The dielectric film 212 may have a thickness of 15-40 micrometers. More specifically, the dielectric film 212 may have a thickness of 35-38 μm.

The metal layer 214 may have a single-, double-, triple-metal layer structure. In the embodiment of FIGS. 2A and 2B, the metal layer 214 has a double-layer structure including first and second metal layers. The first metal layer is a seed layer formed on the dielectric film 212. The first metal layer may be formed through electroless plating or sputtering. The first metal layer may be formed of nickel, chromium, gold or copper. More specifically, the first metal layer may be formed of an alloy of nickel and chromium through sputtering. Alternatively, the first metal layer may be formed of copper through electroless plating.

The thickness of the first metal layer may be determined according to the type of method and the type of material used to form the first metal layer. For example, the first metal layer may be formed to a thickness of about 30 nm by using sputtering and using an alloy of nickel and chromium. Alternatively, the first metal layer may be formed to a thickness of less than 0.2 μm by using electroless plating and using copper. Particularly, when using electroless plating, the thickness of the first metal layer may be altered by adjusting the amount of time for which the dielectric film 212 is immersed in an electroless plating solution.

The circuit patterns 220 may be formed on the metal layer 214 through etching. The circuit patterns 220 include the inner leads 220a, which are connected to the IC 230, and the outer leads 220b, which are connected to a circuit of a driving unit of a display device or to an electrode of a panel of the display device. The pitch of the inner leads 220a and the outer leads 220b may vary according to the resolution of a display device comprising the TCP 200. In general, the inner leads 220a and the outer leads 220b may have a pitch of several tens of micrometers.

The IC 230 is a semiconductor chip which transmits image signals provided by a driving unit of a display device to an electrode of a panel of the display device. The IC 230 is connected to the circuit patterns 220 of the flexible film 210 through the gold bumps 250. More specifically, the IC 230 may be connected to the inner leads 220 of the circuit patterns 220 through the gold bumps 250.

The device hole 260 may be formed in the area where the IC 230 is disposed. After the formation of the device hole 260, flying leads are formed on the circuit patterns 220, to which the IC 230 is connected, and the gold bumps 250 are connected to the flying leads. The flying leads may be plated with tin. By applying heat or ultrasonic waves, a gold-tin bond may be generated between the flying leads plated with tin and the gold bumps 250.

The TCP 200 may include one or more holes 240, which are formed through the flexible film 210. The holes 240 may be spaced apart from the circuit patterns 220 of the flexible film 210 or may be formed on the circuit patterns 220. The holes 240 may be used to align the TCP 200 during the manufacture of a display device.

More specifically, in order to transmit image signals provided by a driving unit of a display device to a panel of the display device, the outer leads 220b of the TCP 200 may need to be aligned with a circuit of the driving unit or an electrode of the panel. The circuit patterns 220 of the TCP 200 may be aligned with a circuit of the driving unit or an electrode of the panel by connecting alignment portions of the driving unit or the panel to the holes 240.

Figure 3A:
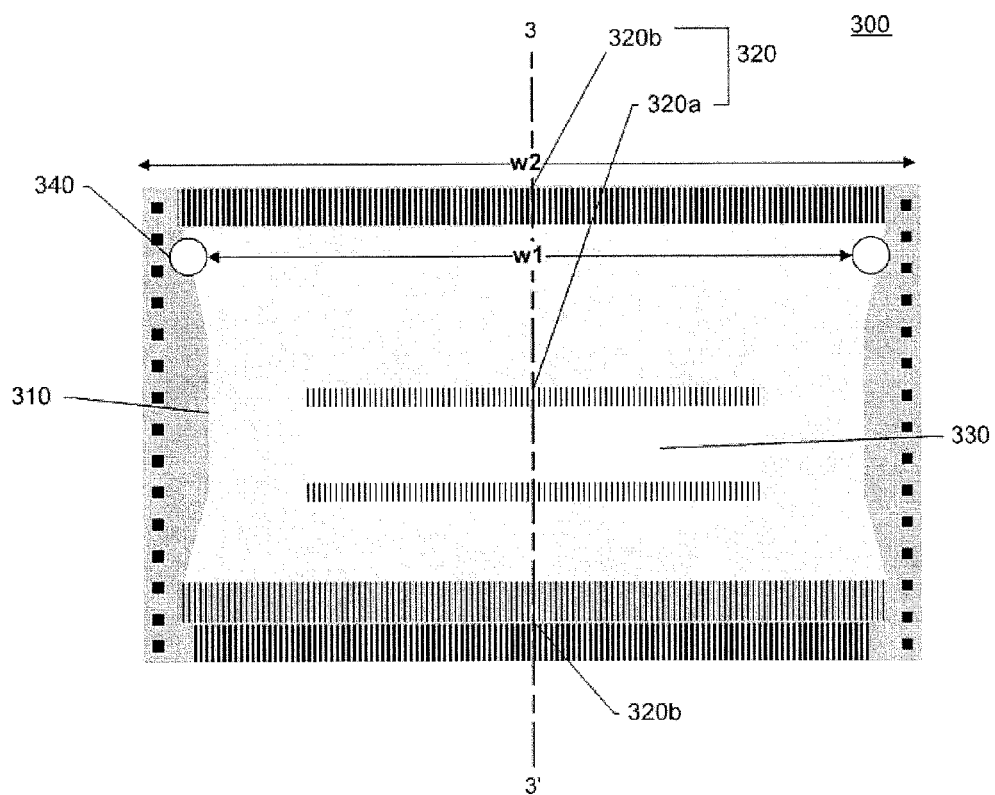
FIGS. 3A and 3B illustrate diagrams of a chip-on-film (COF) comprising a flexible film according to an embodiment of the present invention.
Figure 3B:
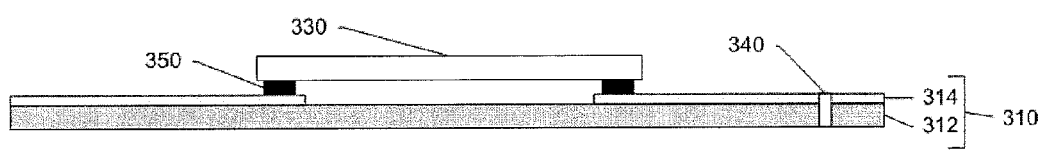

FIGS. 3A and 3B illustrate a plan view and a cross-sectional view, respectively, of a COF 300 including a flexible film 310 according to an embodiment of the present invention. Referring to FIG. 3A, the COF 300 includes the flexible film 310, circuit patterns, which are formed on the flexible film 310, an IC 330, which is connected to the circuit patterns 320, and one or more holes 340, which are formed through the flexible film 310.

FIG. 3B illustrates a cross-sectional view taken along line 3-3' of FIG. 3A. Referring to FIG. 3B, the flexible film 310 may include a dielectric film 312 and a metal layer 314, which is formed on the dielectric film 312. The circuit patterns 320 may be formed by etching the metal layer 314 of the flexible film 310. The circuit patterns 320 include inner leads 320a, which are connected to the IC 330, and outer leads 320b, which are connected to a driving unit or a panel display device. The outer leads 320b may be connected to the driving unit or the panel by an anisotropic conductive film (ACF).

More specifically, the outer leads 320b may be connected to a driving unit or a panel of a display device through outer lead bonding (OLB) pads, and the inner leads 320a may be connected to the IC 330 through inner lead bonding (ILB) pads. The inner leads 320a may be connected to the IC 330 by plating the inner leads 320a with a tin film and applying heat or ultrasonic waves to the thin film so as to generate a gold-tin bond between the inner leads 320a and gold bumps 350, which are formed on the flexible film 310.

The metal layer 314 may have a single-, double-, or triple-metal layer structure. If the metal layer 314 has a single-layer structure, the metal layer 314 may be formed of a highly-conductive metal through either casting or laminating.

If the metal layer 314 has a double-metal layer structure, the metal layer 314 may include a first metal layer, which is formed on the dielectric film 312, and a second metal layer, which is formed on the first metal layer. The first metal layer may be formed through sputtering or electroless plating, and the second metal layer may be formed through electroplating. The first metal layer may include nickel, chromium, gold or copper, and the second metal layer may include gold or copper. More specifically, the first metal layer may be formed of nickel and chromium through sputtering. Alternatively, the first metal layer may be formed of gold or copper through electroless plating. The first metal layer may be formed to a thickness of about 30 nm by using sputtering. Alternatively, the first metal layer may be formed to a thickness of less than 0.2 μm by using electroless plating.

The first metal layer may be formed through electroless plating by immersing the dielectric film 312 in an electroless plating solution containing the ions of a metal to be plated on the dielectric film 312, and adding a reducing agent to the electroless plating solution so as to extract metal ions. The thickness of the first metal layer may be altered by adjusting the amount of time for which the dielectric film 312 is immersed in the electroless plating solution.

When the first metal layer is formed of an alloy of nickel and chromium, the efficiency of electroplating for forming the second metal layer may deteriorate due to a high resistance of the alloy of nickel and chromium. In order to address this, a copper layer may be additionally formed on the first metal layer through sputtering, thereby reducing the resistance of the first metal layer and improving the efficiency of electroplating processing. In this manner, it is possible to obtain a metal layer 314 having a triple-layer structure. The copper layer may be formed to such a thickness that the sum of the thicknesses of the first metal layer and the copper film can be 30 nm or less.

The second metal layer may be formed of gold or copper through electroplating. More specifically, the second metal layer may be formed by immersing the dielectric film 312 on which the first metal layer is formed in an electroplating solution containing copper ions, applying a current and thus extracting the copper ions as copper. The thickness of the second metal layer may be altered by adjusting the intensity of the current and the duration of the application of the current.

The holes 340, which are formed through the flexible film 310, may be used to align the circuit patterns 320 of the COF 300 with a driving unit or a panel of a display device or to test the reliability of the circuit patterns 320. The circuit patterns 320 of the COF 300 may be aligned with a circuit of the driving unit or an electrode of the panel by aligning alignment portions of the driving unit or the panel to the holes 340.

Referring to FIG. 3A, the COF 300 may include two holes 340. In this case, a distance w1 between the first hole and the second hole 340 may be 50-80% of a width w2 of the dielectric film. If the distance w1 is less than 50% of the width w2, the circuit patterns 320 may become defective. On the other hand, if the distance w1 is greater than 80% of the width w2, the holes 340 and the COF 300 may not be able to be properly manufactured because the holes 340 are too close to either side of the COF 300.

FIG. 3B illustrates a cross-sectional view taken along line 3-3' of FIG. 3A. Referring to FIG. 3B, the COF 300 includes the flexible film 310 which includes the dielectric film 312 and the metal layer 314 formed on the dielectric film 312; the IC 230 which is connected to the circuit patterns 320 formed on the metal layer 314; a hole 240 which is formed through the flexible film 310; and gold bumps 350 which connect the IC 230 to the circuit patterns 320.

The dielectric film 312 is a base film of the flexible film 310 and may be formed of a dielectric material such as polyimide, polyester, or a liquid crystal polymer. In particular, the dielectric film 312 may be formed of polyimide or a liquid crystal polymer because polyimide and a liquid crystal polymer have excellent peel strength and thermal resistance properties. The dielectric film 312 may be formed to a thickness of 15-40 μm so as to have appropriate peel strength with respect to the metal layer 314 and have appropriate flexibility. More specifically, the dielectric film 212 may be formed to a thickness of 35-38 μm.

The metal layer 314 is a thin film formed of a conductive metal. If the metal layer 314 has a double-metal layer, the metal layer 314 may include a first metal layer, which is formed on the dielectric film 312, and a second metal layer, which is formed on the first metal layer. The first metal layer may be formed of nickel, chromium, gold, or copper through electroless plating or sputtering, and the second metal layer may be formed of gold or copper through electroplating. The thickness of the metal layer 314 may account for about one tenth to two thirds of the thickness of the dielectric film 312.

The IC 330 is connected to the inner leads 320a of the circuit patterns 320 and transmits image signals provided by a driving unit of a display device to a panel of the display device. The pitch of the inner leads 320a may vary according to the resolution of a display device to which the COF 300 is connected. The inner leads 320a may have a pitch of about 30 μm. The IC 330 may be connected to the inner leads 320a through the gold bumps 350.

Referring to FIG. 3B, the COF 300, unlike the TCP 200, does not have any device hole 250. In addition, the COF 300 is very flexible, and thus, there is no need to additionally form slits in the COF 300 in order to make the COF 300 flexible. Therefore, the efficiency of the manufacture of the COF 300 can be improved. For example, leads having a pitch of about 40 μm may be formed on the TCP 200, and leads having a pitch of about 30 μm can be formed on the COF 300. Thus, the COF 300 is suitable for use in a display device having a high resolution.

The COF 300 may include one or more holes 240, which are formed through the flexible film 310. The holes 340 may be spaced apart from the circuit patterns 320 of the flexible film 310 or may be formed on the circuit patterns 320. The holes 340 may be used to align the COF 300 during the manufacture of a display device.

More specifically, in order to transmit image signals provided by a driving unit of a display device to a panel of the display device, the outer leads 320b of the COF 300 may need to be aligned with a circuit of the driving unit or an electrode of the panel. The circuit patterns 320 of the COF 300 may be aligned with a circuit of the driving unit or an electrode of the panel by connecting alignment portions of the driving unit or the panel to the holes 340.

Figure 4:
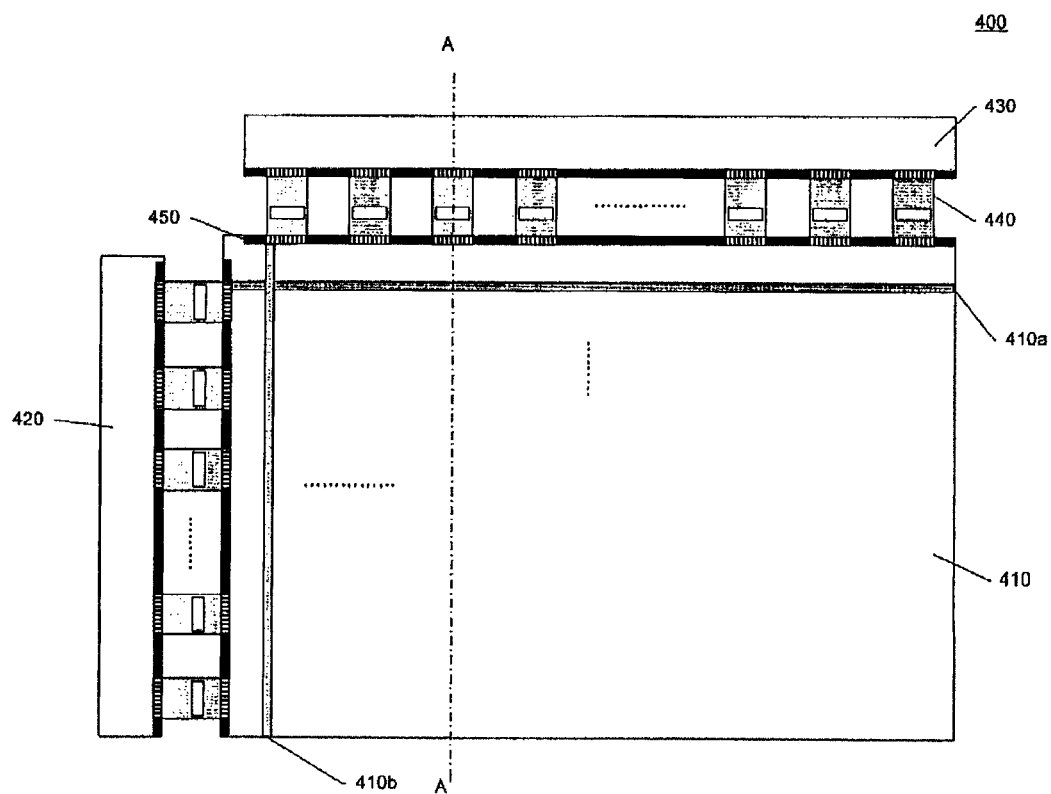
FIG. 4 illustrates diagram of a display device according to an embodiment of the present invention.

FIG. 4 illustrates diagram of a display device according to an embodiment of the present invention.

Referring to FIG. 4A, the display device 400 includes a panel 410, driving units 420 and 430, which apply an image signal to the panel 410, a plurality of flexible films 440, which connect the panel 410 to the driving units 420 and 430, and a plurality of conductive films 450, which attach the flexible films 440 on the panel 410 or on the driving units 420 and 430.

The display device 400 is a flat panel display (FPD) such as a liquid crystal display (LCD), a plasma display panel (PDP), or an organic light-emitting diode (OLED).

The panel 410 includes a plurality of pixels for displaying an image. A plurality of electrodes may be arranged on the panel 410 and may be connected to the driving units 420 and 430. The pixels are disposed at the intersections among the electrodes. More specifically, the electrodes include a plurality of first electrodes 410a and a plurality of second electrodes 410b, which intersect the first electrodes 410a. The first electrodes 410a may be formed in row direction, and the second electrodes 410b may be formed in a column direction.

The driving units 420 and 430 may include a scan driver 420 and a data driver 430. The scan driver 420 may be connected to the first electrodes 410a, and the data driver 430 may be connected to the second electrodes 410b.

The scan driver 420 applies a scan signal to each of the first electrodes 410a and thus enables the data driver 430 to transmit a data signal to each of the second electrodes 410b. When the scan driver 420 applies a scan signal to each of the first electrodes 410a, a data signal can be applied to the first electrodes 410a, and an image can be displayed on the panel 400 according to a data signal transmitted by the data driver 430. Signals transmitted by the scan driver 420 and the data driver 430 may be applied to the panel 400 through the flexible films 440.

The flexible films 440 may have circuit patterns printed thereon. Each of the flexible films 440 may include a dielectric film, a metal layer, which is formed on the dielectric film, and an IC, which is connected to circuit patterns printed on the metal layer. Image signals applied by the driving units 420 and 430 may be transmitted to the first second electrodes 410a and the second electrodes 410b on the panel 410 through the circuit patterns and the IC of each of the flexible films 440. The flexible films 440 may be connected to the panel 410 and to the driving units 420 and 430 by the conductive films 450.

The conductive films 450 are adhesive thin films. The conductive films 450 may be disposed between the panel 410 and the flexible films 440, between the driving units 420 and 430 and the flexible films 440. The conductive films 450 may be anisotropic conductive films (ACFs).

According to the present invention, a flexible film 440 has at least one hole. Thus, it is possible to facilitate the alignment of circuit patterns of a flexible film 440 with an electrode of a panel 410 of a display device 400 or a circuit of a driving unit 420 and 430 of a display device 400 and to improve the efficiency of testing the reliability of a flexible film 440. In addition, according to the present invention, there is no need to provide space for mounting an IC on a panel 410 of a display device 400. Thus, it is possible to improve the efficiency of the manufacture of a display device 400.

Figure 5:
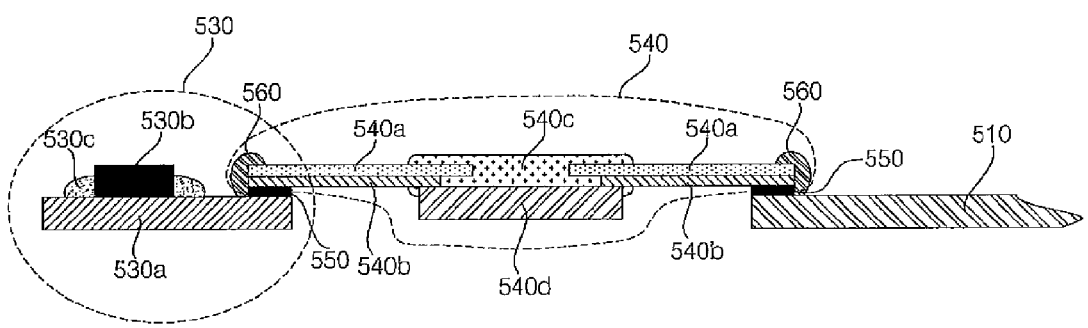
FIG. 5 illustrates a cross-sectional view of the display device 400 in FIG. 4.

FIG. 5 is a cross-sectional view taken along line A-A' of the display device 400 in FIG. 4.

With reference to FIG. 5, the display device 500 comprises the panel 510 displaying an image, the data driver 530 that applies an image signal to the panel 510, the flexible film 540 connecting with the data driver 530 and the panel 510, and the conductive films 550 that electrically connects the flexible film 540 to the data driver 530 and the panel 510.

According to the embodiment of the present invention, the display device 500 may further comprise a resin 560 sealing up portions of the flexible film 540 contacting the conductive films 550. The resin 560 may comprise an insulating material and serve to prevent impurities that may be introduced into the portions where the flexible film 540 contacting the conductive films 550, to thus prevent damage of a signal line of the flexible film 540 connected with the panel 510 and the data driver 530, and lengthen a life span.

Although not shown, the panel 510 may comprise a plurality of scan electrodes disposed in the horizontal direction and a plurality of data electrodes disposed to cross the scan electrodes. The data electrodes disposed in the direction A-A' are connected with the flexible film 540 via the conductive film 550 as shown in FIG. 5 in order to receive an image signal applied from the data driver 530 and thus display a corresponding image.

The data driver 530 includes a driving IC 530b formed on a substrate 530a and a protection resin 530c for protecting the driving IC 530b. The protection resin 530c may be made of a material with insulating properties and protects a circuit pattern (not shown) formed on the substrate 530a and the driving IC 530b against impurities that may be introduced from the exterior. The driving IC 530b applies an image signal to the panel 510 via the flexible film 540 according to a control signal transmitted from a controller (not shown) of the display device 500.

The flexible film 540 disposed between the panel 510 and the data driver 530 includes polyimide film 540a, metal film 540b disposed on the polyimide films 540a, an IC 540c connected with a circuit pattern printed on the metal film 540b, and a resin protection layer 540d sealing up the circuit pattern and the IC 540c.

Figure 6:
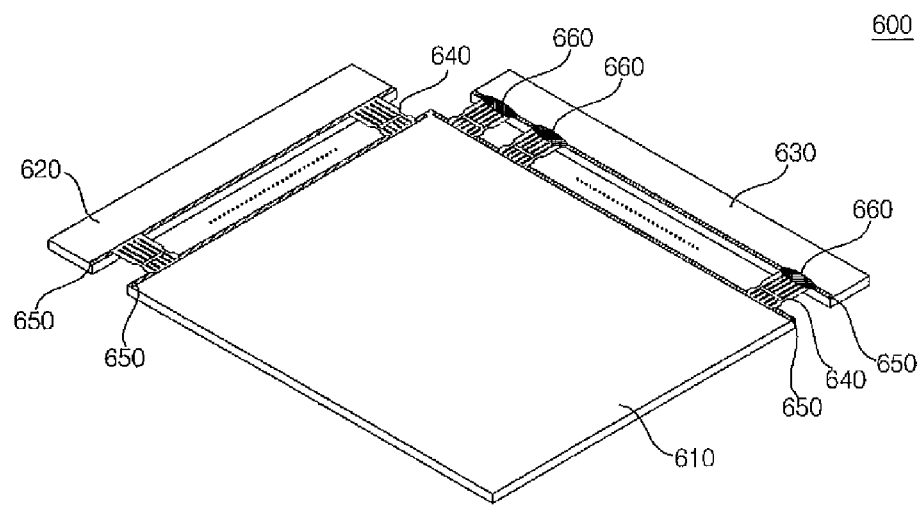
FIG. 6 illustrates diagram of a display device according to an embodiment of the present invention.

FIG. 6 illustrates diagram of a display device according to an embodiment of the present invention.

When the flexible films 640 are attached with the panel 610 and the driving units 620 and 630 through the conductive films 650, the flexible films 640 attached with the conductive films 650 can be sealed with the resin 660. With reference to FIG. 6, because the positions of the flexible films 640 attached to the conductive films 650 can be sealed with the resin 660, impurities that may be introduced from the exterior can be blocked.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flexible film comprising:
a dielectric film;
a metal layer comprising a first metal layer disposed on the dielectric film, a second metal layer disposed on the first metal layer, and a third metal layer disposed on the second metal layer;
printed circuit patterns printed on the metal layer;
an integrated circuit (IC) chip disposed on the metal layer; and
at least one first hole and at least one second hole formed through the dielectric film and the metal layer, wherein each of the at least one first hole and the at least one second hole have an inner vacant space,
wherein the printed circuit patterns include an inner lead connected to the IC chip and an outer lead positioned at an end of the dielectric film,
wherein the first hole is positioned at one side of a region between the inner lead and the outer lead and the second hole is positioned at the other side of the region between the inner lead and the outer lead,
wherein the first hole and the second hole are adjacent to the outer lead more than the inner lead,
wherein a distance between the at least one first hole and the at least one second hole ranges from about 50-80% of a width of the dielectric film,
wherein the at least one first hole and the at least one second hole are spaced apart from the printed circuit patterns,
wherein the first metal layer is a sputtered metal layer comprising an alloy of nickel and chromium,
wherein the second metal layer is a sputtered metal layer comprising copper, and
wherein the third metal layer is an electroplated metal layer comprising copper or gold.

2. The flexible film of claim 1, further comprising:
gold bumps disposed on the metal layer,
wherein the IC chip is connected to the circuit patterns through the gold bumps.

3. The flexible film of claim 1, further comprising a device hole formed in an area in which the IC chip is disposed.

4. The flexible film of claim 1, wherein the ratio of the thickness of the metal layer to the thickness of the dielectric film is about 1:1.5 to 1:10.

5. A display device comprising:
a panel;
a driving unit; and
a flexible film disposed between the panel and the driving unit,
wherein the flexible film comprises:
a dielectric film;
a metal layer comprising a first metal layer disposed on the dielectric film, a second metal layer disposed on the first metal layer, and a third metal layer disposed on the second metal layer;
printed circuit patterns formed on the metal layer;
an integrated circuit (IC) chip disposed on the metal layer; and
at least one first hole and at least one second hole formed through the dielectric film and the metal layer, wherein each of the at least one first hole and the at least one second hole have an inner vacant space,
wherein the printed circuit patterns include an inner lead connected to the IC chip and an outer lead positioned at an end of the dielectric film,
wherein the first hole is positioned at one side of a region between the inner lead and the outer lead and the second hole is positioned at the other side of the region between the inner lead and the outer lead,
wherein the first hole and the second hole are adjacent to the outer lead more than the inner lead,
wherein a distance between the at least one first hole and the at least one second hole ranges from about 50-80% of a width of the dielectric film,
wherein the at least one first hole and the at least one second hole are spaced apart from the printed circuit patterns,
wherein the first metal layer is a sputtered metal layer comprising an alloy of nickel and chromium,
wherein the second metal layer is a sputtered metal layer comprising copper, and
wherein the third metal layer is an electroplated metal layer comprising copper or gold.

6. The display device of claim 5, wherein the panel comprises:
a first electrode; and
a second electrode intersecting the first electrode,
wherein the first and second electrodes are connected to the circuit patterns.

7. The display device of claim 5, further comprising a conductive film connecting at least one of the panel and the driving unit to the flexible film.

8. The display device of claim 7, wherein the conductive film is an anisotropic conductive film.

9. The display device of claim 7, further comprising a resin sealing up a portion of the flexible film contacting the conductive film.

\* \* \* \* \*